(12) United States Patent
Pullen et al.

(10) Patent No.: US 6,304,137 B1
(45) Date of Patent: Oct. 16, 2001

(54) OUTPUT STAGE FOR HIGH POWER CLASS D AMPLIFIERS

(75) Inventors: Stuart W. Pullen, Raleigh, NC (US); John Ulrick, Woodland Hills, CA (US); Michael M. Walters, Apex, NC (US)

(73) Assignee: Red Chip Company Limited, Tortola (VG)

( * ) Notice: Subject to any disclaimer, the term of this patent is extended or adjusted under 35 U.S.C. 154(b) by 0 days.

(21) Appl. No.: 09/472,317

(22) Filed: Dec. 23, 1999

(51) Int. Cl.[7] .............................. H03F 3/38; H03F 21/00; H03F 3/217; H02M 1/12

(52) U.S. Cl. .................. 330/10; 330/207 A; 330/251; 363/41

(58) Field of Search ................. 330/10, 207 A, 330/251; 363/41

(56) References Cited

U.S. PATENT DOCUMENTS

| | | | |
|---|---|---|---|
| 5,160,896 | * 11/1992 | McCorkle | 330/251 |
| 5,479,337 | * 12/1995 | Voigt | 330/10 |
| 5,898,340 | * 4/1999 | Chatterjee et al. | 330/251 |
| 5,946,208 | * 8/1999 | Yamamoto et al. | 363/41 |
| 5,963,086 | * 10/1999 | Hall | 330/10 |

* cited by examiner

Primary Examiner—Robert J. Pascal
Assistant Examiner—Patricia T. Nguyen
(74) Attorney, Agent, or Firm—Jaeckle Fleischmann & Mugel, LLP

(57) ABSTRACT

An output stage for a class D amplifier reduces distortion and EMI, and greatly improves the efficiency. The output stage employs a combination of techniques including a soft switching network, multiple output inductors and beads to achieve, a high power full range class D amplifier that is complies with all FCC and CE specifications with greater than 90% efficiency at ⅓ power.

21 Claims, 5 Drawing Sheets

NEW OUTPUT STAGE FOR CLASS D MODULATOR

FIG. 7 NEW OUTPUT STAGE FOR CLASS D MODULATOR

OUTPUT STAGE FOR HIGH POWER CLASS D AMPLIFIERS

This invention describes an improved output stage for class D amplifiers. The new output stage reduces distortion and electromagnetic interference (EMI), and greatly improves the efficiency of the amplifier. This invention employs a combination of techniques including soft switching, multiple output inductors and ferrite beads to achieve the desired result: a high power full range class D amplifier that is complies with all FCC and CE specifications with greater than 90% efficiency at ⅓ power.

BACKGROUND

Class D amplifiers convert an audio signal into high-frequency pulses that switch the output in accordance with the audio input signal. Some class D amplifier use pulse width modulators to generate a series of conditioning pulses that vary in width with the audio signal's amplitude. The varying-width pulses switch the power-output transistors at a fixed frequency. Other class D amplifier rely upon pulse density modulators. Still other class D amplifiers may rely upon other types of pulse modulators. For heuristic purposes, the following discussion will only refer to pulse width modulators, but those skilled in the art will recognize that class D amplifiers may be configured with other types of modulators. The output of the class D amplifier is fed into a lowpass filter that converts the pulses back into an amplified audio signal that drives one or more audio speakers. This design approach produces an amplifier with better than 90% efficiency and that is more complex than its linear counterpart.

The class D amplifier requires an integrator, a duty-cycle modulator, a switch predrive circuit, and an output filter. The half-bridge class D amplifier using constant-frequency, duty-cycle modulation (FIG. 8), sums the square-wave output of the switching power transistors with the audio input to provide negative feedback. One cannot take the feedback after the lowpass filter unless one uses a complicated compensation network to handle the phase shift that the filter introduces. A two-pole filter, for example, would introduce a 180.degree. phase shift, which would cause the circuit to oscillate.

The square-wave output is synchronous with the audio input, but one must remove the carrier. The integrator sums the two signals and simulates the effect of the output filter. The circuit feeds the resultant error signal into the duty-cycle modulator, which comprises a comparator and a triangle-wave generator (FIGS. 9 and 10). Then, the circuit compares the triangle wave to the error signal to produce the modulated output.

The modulated output is a square wave whose duty cycle is proportional to the input signal. In the half-bridge circuit, this output drives the upper and lower power switches in antiphase; the circuit always drives one switch into saturation while it cuts the other off. The square wave causes the switches to change state as fast as possible, given the technology used to implement the switch. Fast switching limits the time that the switches spend in the linear operating region, thereby increasing efficiency and reducing heat generation. The combination of switching and conduction losses defines the upper bound of the amplifier's efficiency. The circuit filters out the high-frequency square wave that the power switches generate, leaving only the amplified audio signal. This signal then drives a ground-referenced speaker load.

Class D amplifiers are well known for their high efficiency which is typically greater than 90% at full power. But like class AB amplifiers, the efficiency of a class D amplifier is poor at low powers. This is especially true in full bandwidth class D amplifiers where the switching frequency is very high, 500 khz or greater. At low powers, the switching losses prevent class D amplifiers from achieving 90% efficiency. This is important in music applications which have a low average power with high peak powers. Thus, the efficiency benefits of class D amplifiers are rarely realized to their full potential in music applications. High power class D amplifiers radiate electromagnetic interference. This radiation can interfere with other electronics components. Such electromagnetic interference (EMI) is one of the main reasons that class D amplifiers have yet to be adopted as the industry standard. The output stage discussed below reduces EMI by minimizing both di/dt and dv/dt spikes. The result is a more efficient power amplifier that does not interfere with other electronic equipment.

SUMMARY

The invention implements active soft switching along with ferrite beads and a core reset network to reduce the switching losses and EMI generally associated with a high power class D amplifier. The beads are placed in series with the mosfets inside the current loop that recovers the charge stored in the commutating diodes. A core reset network includes a zener and diode which allows the core to reset every time the mosfets turn off. The reset network prevents the beads form saturating. To better control the recovery current in the commutating diodes, active soft switching with an adjustable turn on delay is included. This delay prevents the pmos from turning on prematurely and thus eliminates the risk of hard switching. Two small inductors are included between the mosfets. These inductors eliminate the risk of shoot through current when both mosfets are on, and thus allow for a very small dead time.

DETAILED DESCRIPTION

Figure 1A:
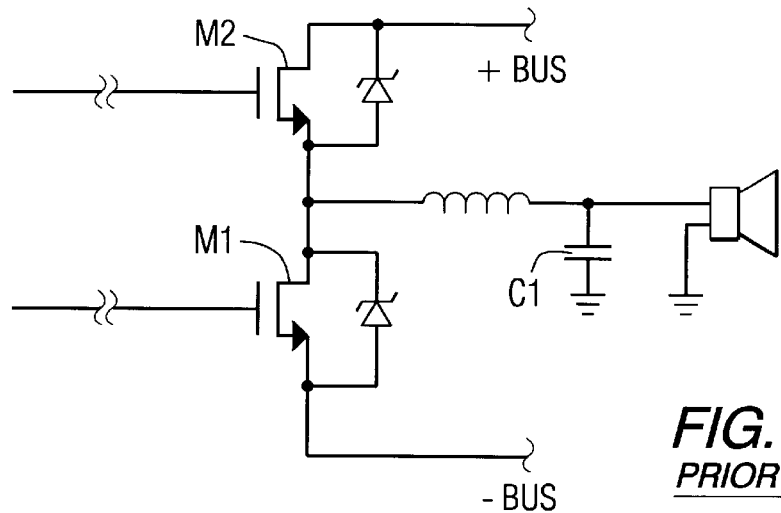
FIG. 1A is a schematic for a low voltage half bridge output stage.

FIG. 1A depicts the output stage that is typically used in low voltage applications. Shottky diodes D1, D2 are placed in parallel with the body diode of the mosfets M1, M2. If $I_L$ is flowing into the bridge as shown, when M2 turns off, IL will flow through D2 until M1 turns on. This deadtime is necessary to ensure that M2 turns off before M1 turns on. This technique only works when the forward drop of the Schottky diode D1, D2 is lower than that of the body diode built into the mosfets. The body diode is too slow to use in high frequency switching amplifiers because the body diode stores too much charge and takes too long to recover. Since the forward drop of a Shottky diode increases with its blocking voltage, the technique shown in FIG. 1A is only suitable when the bus voltage is low, less than 20 v.

Figure 1B:
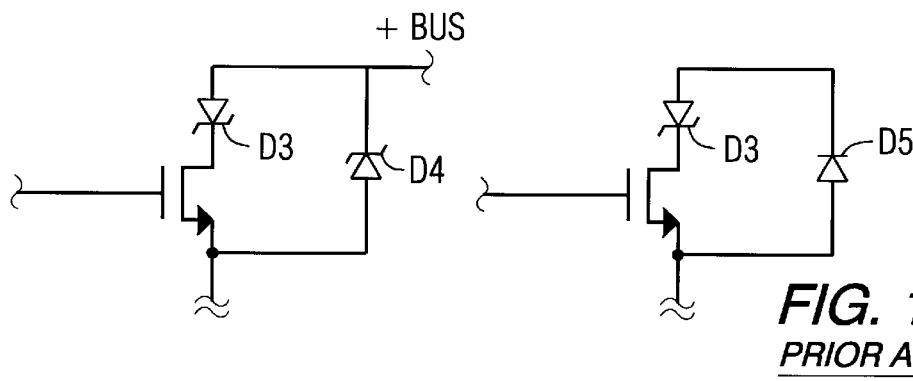
FIG. 1B is a schematic for a high voltage output stage.

At higher bus voltages the body diode must be blocked with a series Shottky diode, D3 in FIG. 1B. A Shottky or ultrafast silicon diode D4 is placed around the series Shottky D3 and mosfet to handle the commutating current. Shottky diodes are preferred to silicon diodes because Shottky diodes have no stored charge. For economical reasons fast silicon diodes are generally used. Since these have a finite stored charge, the recovery of this diode often creates very high di/dt spikes which in turn lead to radiation and EMI.

Figure 2:
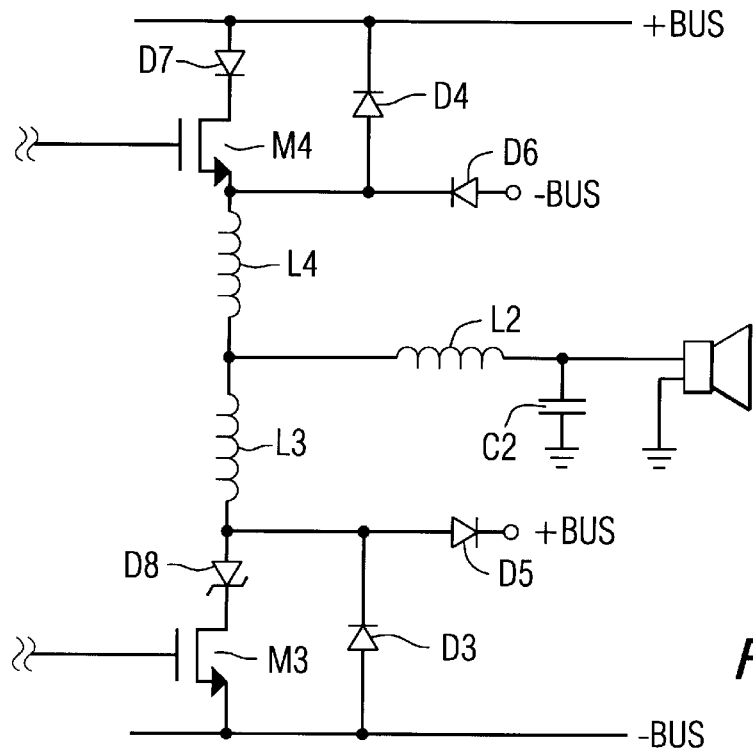
FIG. 2 is a schematic for an output stage that uses inductance to eliminate the dead time.

FIG. 2 shows a halfbridge that uses Shottky diodes D7, D8 to block the body diode and ultrafast recovery silicon diodes D3, D4 to commute the load current. Two inductors L3 and L4 limit the shoot through current in the mosfets. This allows the dead time to be very small. Since dead time is the primary source of distortion in Class D amplifiers, these inductors are all but required to achieve low distortion. Unfortunately, these inductors do not limit the recovery current of D5 and D6, the commutating diodes. Thus, L3 and L4 do not help with EMI.

Figure 3:
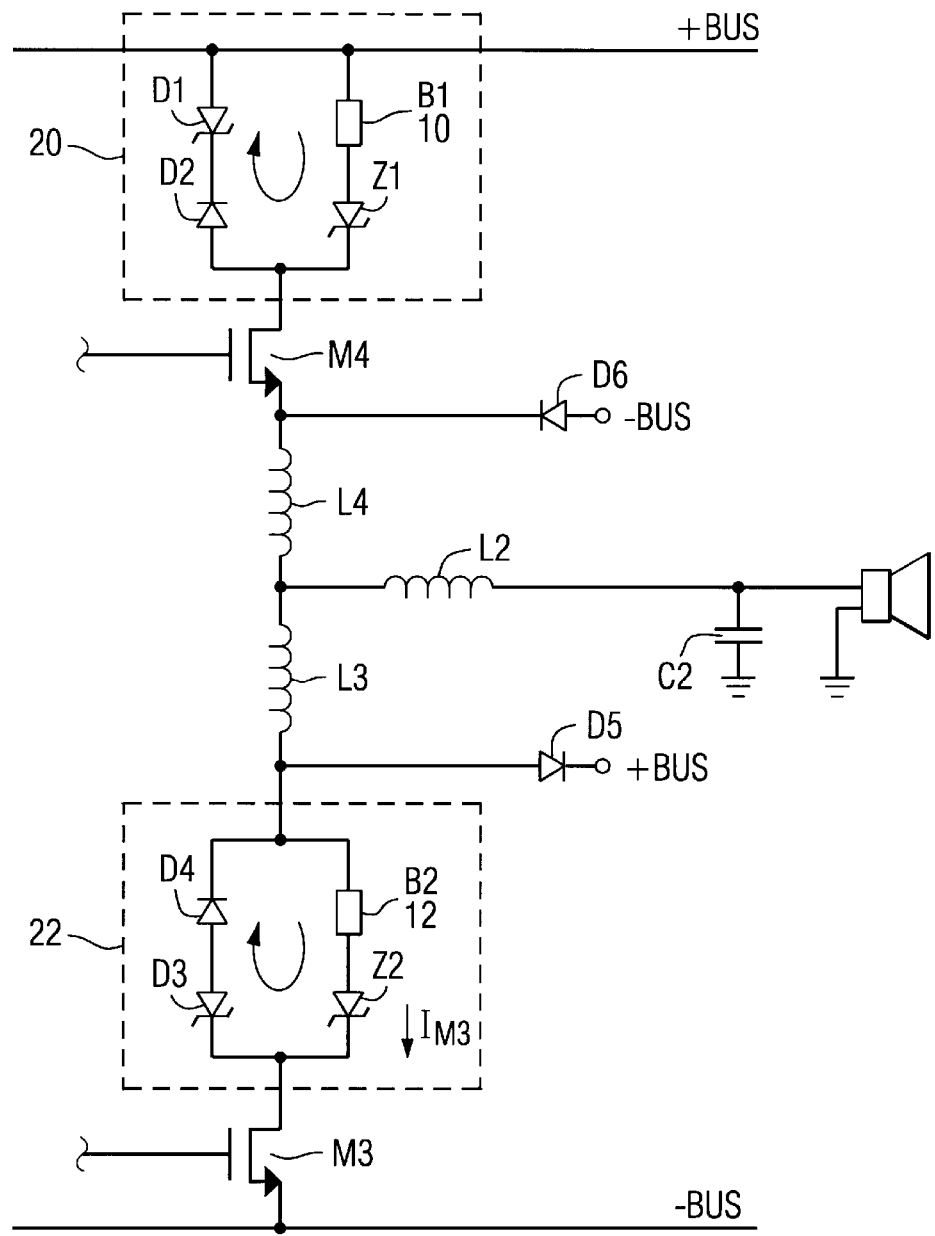
FIG. 3 is a schematic for an improved output stage that uses beads to recover the commutating diodes.

FIG. 3 shows the solution. Ferrite beads 10, 12 are added in series with both mosfets. To prevent saturation bead recovery networks 20, 22 are used in parallel with each bead device 10, 12. The networks 20, 22 allow the beads 10, 12 to reset and thus prevent saturation. Since the beads 10, 12 are in the recovery path of diodes D5 and D6, they limit the recovery current, reduce switching losses, and EMI. Z1 and Z2 are 13.6 v zener diodes. D4 and D2 are standard silicon diodes. To understand the recovery networks 20, 22, consider the case when current is flowing in M3 as shown in FIG. 3. When M3 turns off, the load current commutes to the diode, D5. Since the ferrite bead 12 is a lossy inductor the current in it must continue to flow through D3, Z2, and D4. The voltage on the drain of M3 is limited by the recovery network 22 to two diodes plus the zener breakdown of Z2. This circulating current decays while the upper mosfet M4 turns on. Because drain blocking diodes D1, D3 are used, the upper mosfet M4 supplies no current and is not involved in the circuit until the current reverses. By judicious choice of Z2, the current circulating in the recovery network will decay to zero before M3 turns on. The bead will limit the recovery current in D5 as its core has been reset. When done correctly the result is zero current switching.

Figure 4:
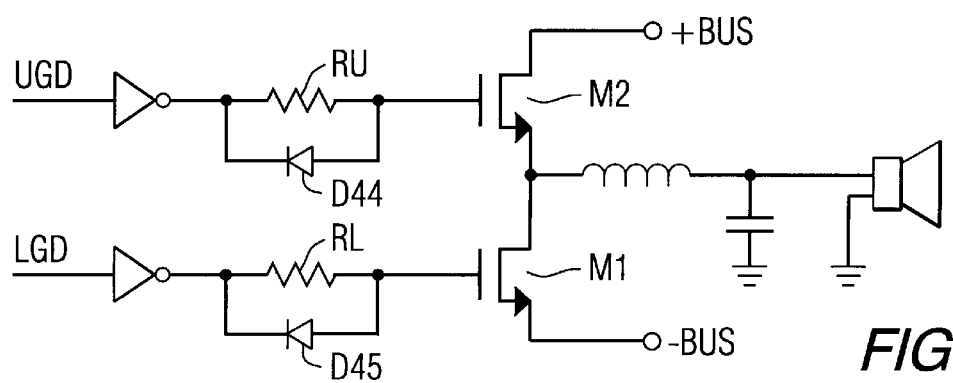
FIG. 4 is a schematic for a gate drive circuit with passive soft switching.
Figure 5:
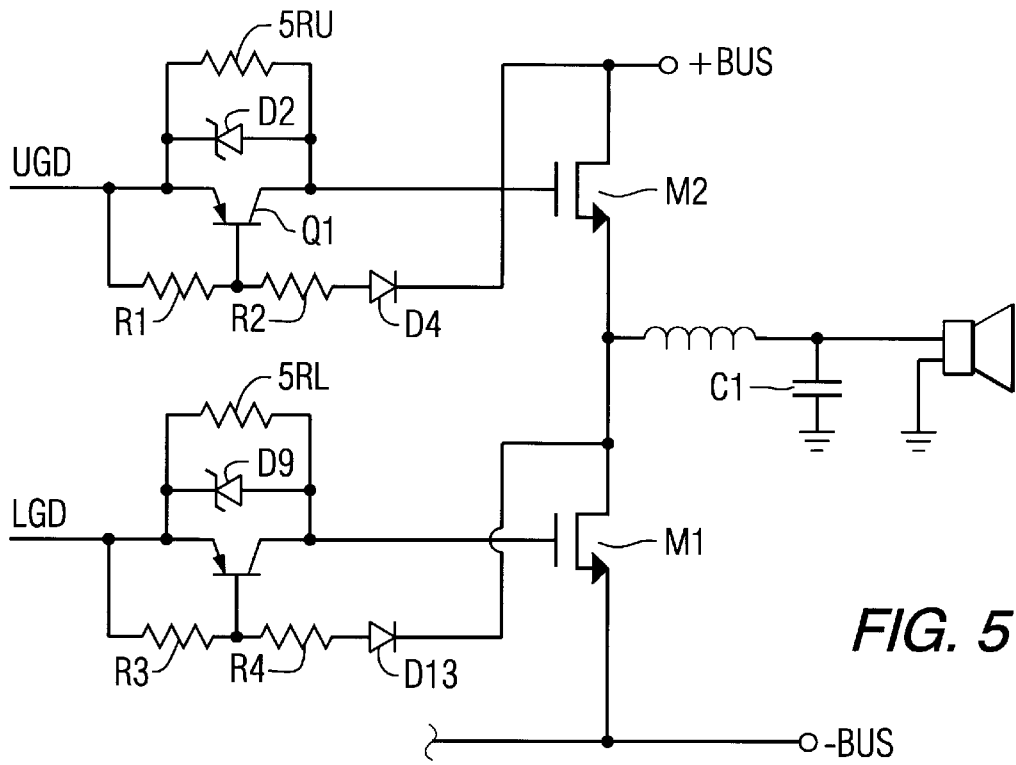
FIG. 5 is a schematic for a gate drive circuit which implements active soft switching.

Further improvements to the circuit in FIG. 3 include the addition of soft switching. Passive soft switching is shown in FIG. 4. The resistors RU, RL turn on the mosfets M1, M2 slowly and the anti-parallel diodes D44 and D45 allow for a fast turn off. This circuit is limited in frequency because the slow turn on increases conduction losses. Full bandwidth audio require switching frequencies around 500 kHz. The increased conduction loss counteracts the benefit of soft switching at these high switching frequencies. FIG. 5 uses active soft switching to reduce conduction loss. Consider the UGD circuit first. At turn on, the gate of M2 charges slowly through a the resistor 5RU which is generally five (5) times greater than the corresponding resistor RU used in passive soft switching. When the source of M2 rises above +Bus, the UGD voltage will be at +Bus+12 v. D4 and R2 will turn on the PNP, Q1, quickly enhancing the mosfet M2. This minimizes conduction losses, because turn on is slow while the output rises very quick after the transition. Quick turn off is provided by D2. The circuit associated with the lower gate is functionally identical.

Figure 6:
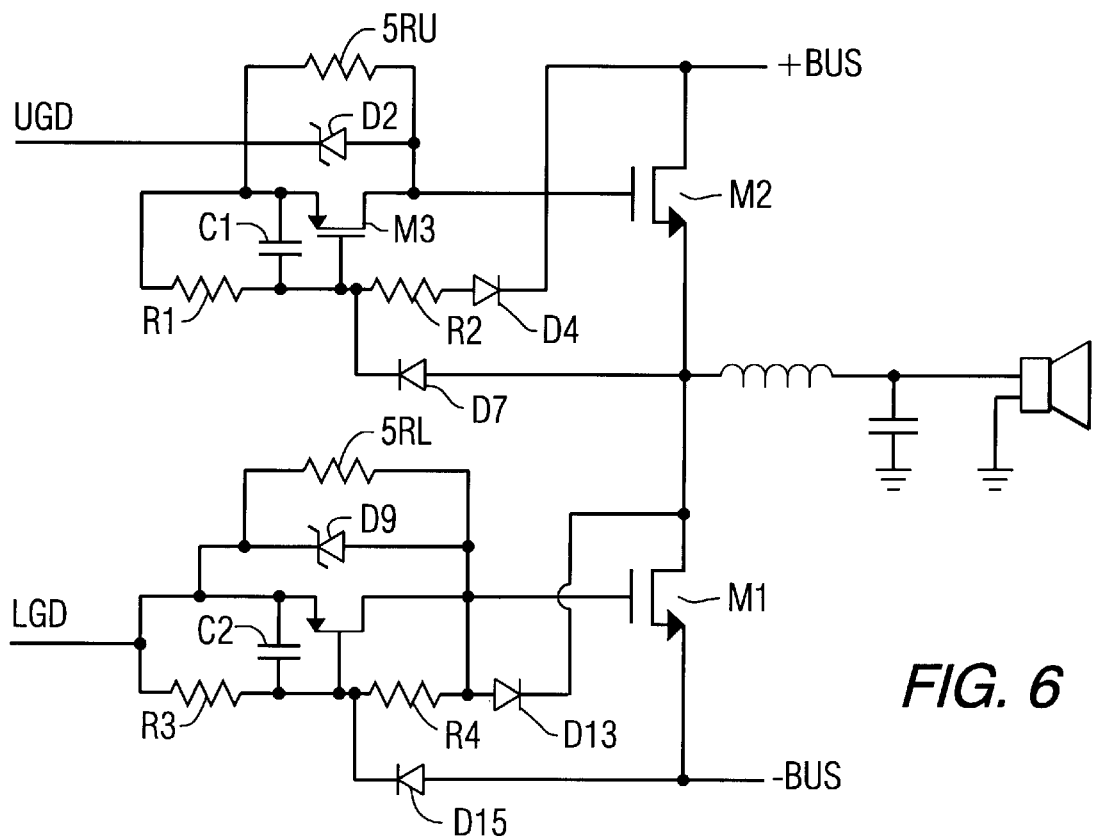
FIG. 6 is a schematic for a gate drive circuit with active switching and adjustable turn on delay.

Active soft switching encounters two problems: the PNP Q1, Q2 can turn on while the output is still transitioning and it can also turn on as soon as the UGD signal transitions from low to high (as the emitter is pulled high, the base to collector capacitance tends to keep the base, from following the emitter). FIG. 6 solves both problems with the addition of capacitors C1 and C2. This implementation uses pmos devices M3, M4 instead of bipolar transistors, but both will work. The capacitance forces the gate to track the source when either UGD or LGD transitions high. Filters R1, C1 and R2, C2 also create an adjustable delay which prevents the pmos from turning on while the output is transitioning.

Figure 7:
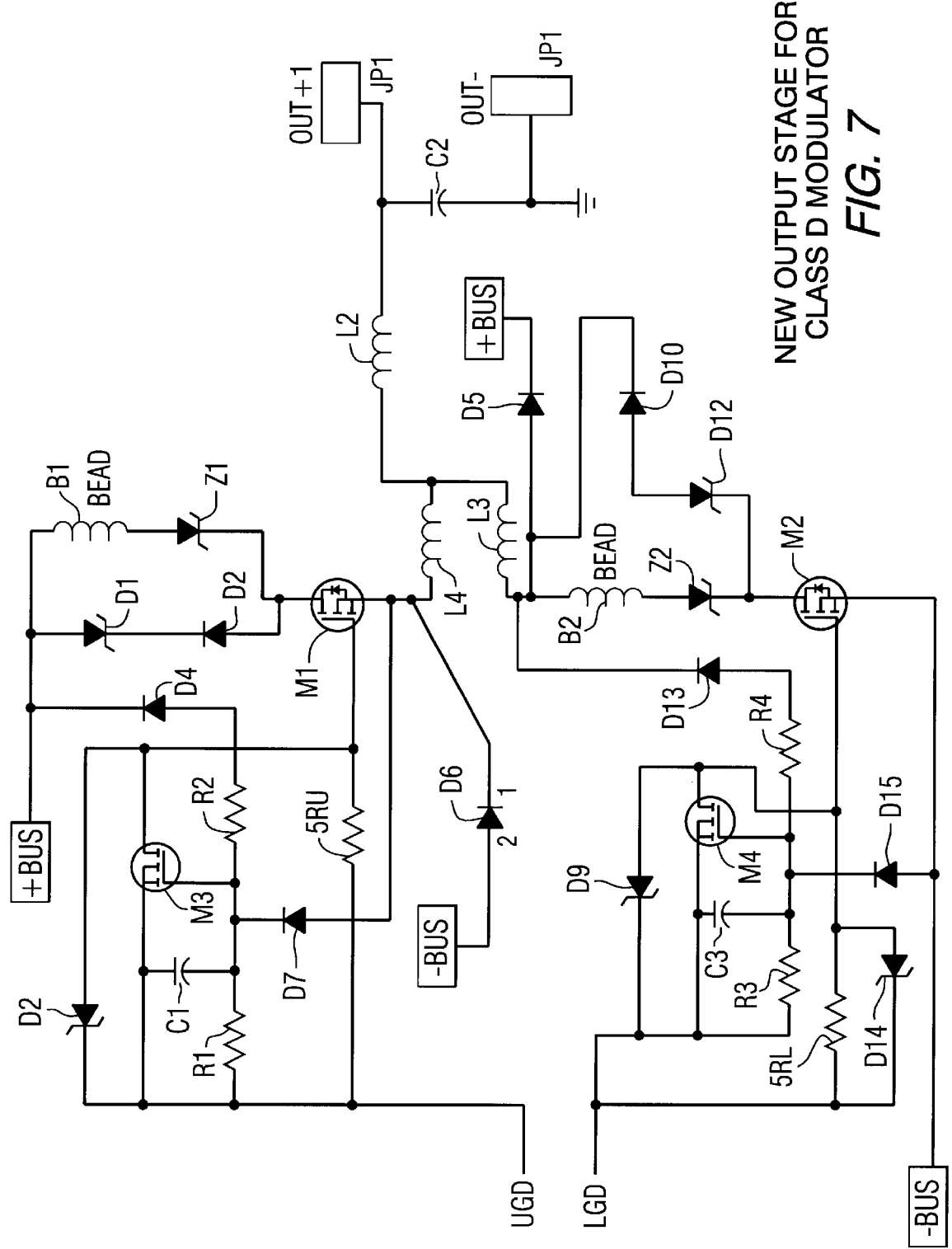
FIG. 7 is a schematic for anew output stage for class D modulators which incorporates active soft switching with an adjustable delay and uses beads to recover the commutating diodes.
Figure 8:
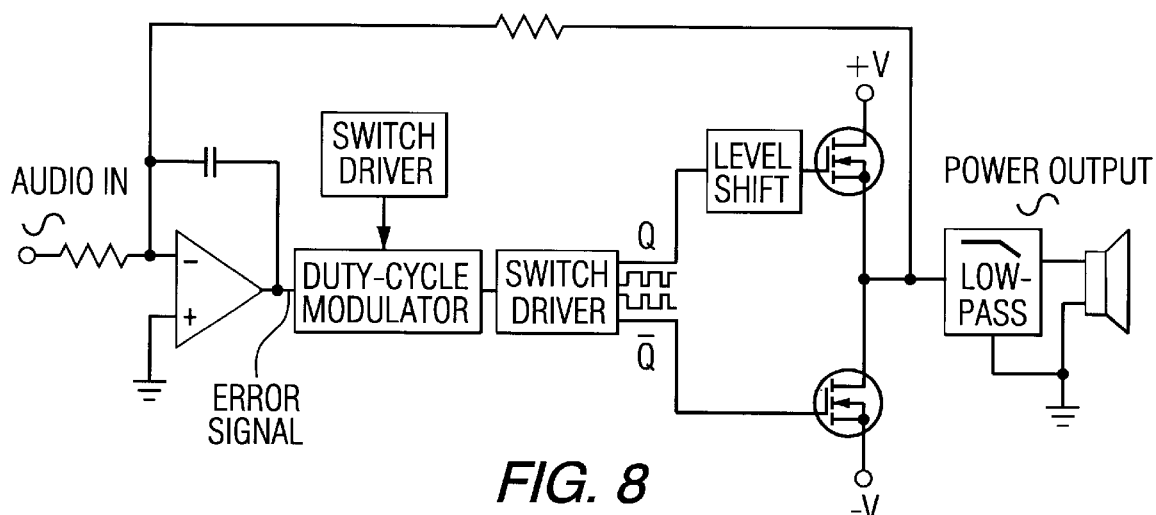
FIG. 8 is a circuit diagram of a prior art class D amplifier.
Figure 9:
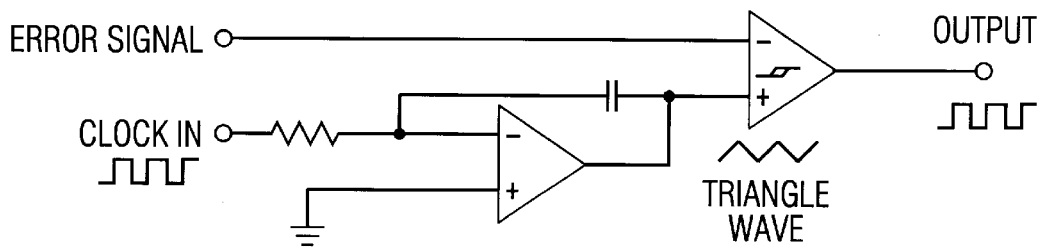
FIG. 9 is a partial circuit diagram of a prior art duty-cycle modulator/comparator.
Figure 10:
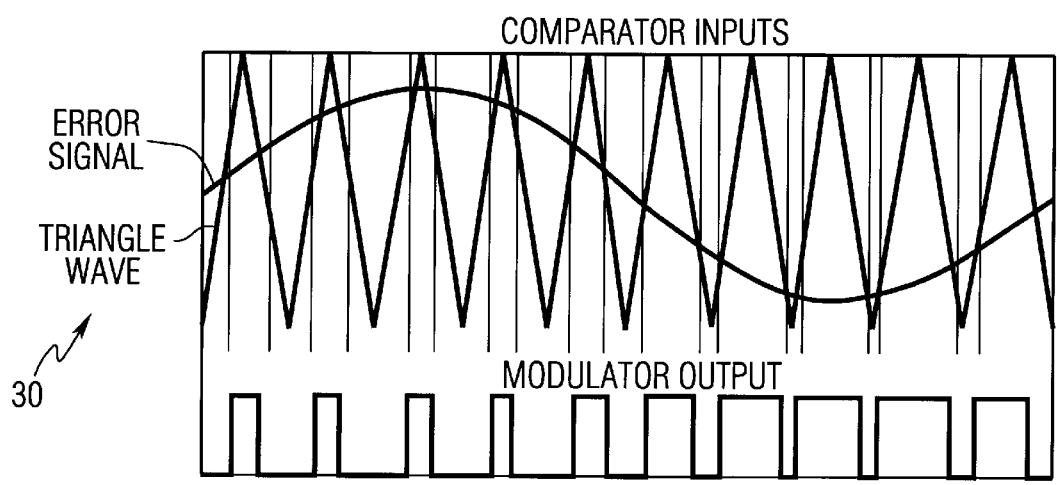
FIG. 10 is a waveform diagram of the input signals and the output signal of a prior art class D amplifier.

FIG. 7 shows how all the pieces fit together. Active soft switching with an adjustable delay is comprised of M3, C1, R1, R2, D4, 5RU, D2 in the upper gate drive circuits and M4, C3, R3, R4, 5RL, D13 in the lower gate drive circuit The lower recovery network includes a ferrite bead B2, Z2, D12 and D10. The upper network includes D1, D2, Z1 and B1. The commutating diodes are ultrafast silicon, D5 and D6. The drain blocking diodes are Z2 and Z1.

When active soft switching and beads with recovery networks are employed together the improvements in performance are substantial, Efficiency of 90% is possible at ⅓ power, because switching and conduction losses are, minimized. With proper adjustment of the recovery network, the circulating current will decay before mosfet turn on resulting in zero current switching. Since the beads limit di/dt and dv/dt electromagnetic radiation is minimal. This technique has been successfully employed to build a CE/FCC compliant 1000 watt class D amplifier with 92% efficiency at 330 watt. Efficiency at higher power approaches 96%.

While the above description provides one or more examples of the invention, those skilled in the art may make further changes, additions, modifications and deletions to described components without departing from the spirit and scope of the appended claims.

What is claimed is:

1. A class D amplifier with reduced electromagnetic interference comprising:

upper and lower power supply buses;

a pulse width modulator coupled between the supply busses for receiving an input audio signal and for generating a pulse width modulated output signal where the width of a pulse is proportional to the amplitude of the audio input;

an output bridge with upper and lower mosfets, wherein the output of the pulse width modulator is coupled to the gates of the bridge mosfets;

first and second inductors, each coupled to an output terminal of the amplifier and the first inductor coupled to the upper mosfet and the second inductor coupled to the lower mosfet;

first and second commutating diodes, the first commutating diode coupled to first inductor and to the lower bus and the second commutating diode coupled to the second inductor and to the upper bus;

a first diode and bead network coupled in series with the upper mosfet and the upper bus; and a second diode and bead network coupled in series with the lower mosfet and the lower bus.

2. The class D amplifier of claim 1 wherein the first and second diode and bead networks each comprise a ferrite bead device in series with a first diode and a zener diode and a second diode in series with each other and in parallel with the bead and first diode.

3. The class D amplifier of claim 1 further comprising first and second soft switching networks in series, respectively with the gates of the upper and lower mosfets.

4. The class D amplifier of claim 3 wherein each of the soft switching networks comprises a parallel arrangement of a first resistor, a forward blocking diode, a transistor with input and output terminals in parallel with the forward blocking diode and a control terminal, and a series circuit comprising one or more resistors and a reverse blocking diode and coupled to the control terminal of the transistor.

5. The class D amplifier of claim 4 wherein the transistor is bipolar transistor with its collector and emitter coupled in parallel with the forward blocking diode and its base coupled to the series circuit.

6. The class D amplifier of claim 4 wherein the transistor is mosfet transistor with its source and drain coupled in parallel with the forward blocking diode and its gate coupled to the series circuit.

7. The class D amplifier of claim 3 wherein each soft switching network further comprises a capacitor coupled between one of the input or output terminals of the transistor and to the control terminal of the transistor.

8. The class D amplifier of claim 7 wherein the transistors are bipolar transistors and the capacitors are connected from the emitter or collector to the base.

9. The class D amplifier of claim 7 wherein the transistors are mosfets and the capacitors are connected from the source or drain to the gate.

10. A class D amplifier with reduced electromagnetic interference comprising:
   upper and lower power supply buses;
   a pulse width modulator coupled between the supply busses for receiving an input audio signal and for generating a pulse width modulated output signal where the width of a pulse is proportional to the amplitude of the audio input;
   an output bridge with upper and lower mosfets, wherein the output of the pulse width modulator is coupled to the gates of the bridge mosfets;
   first and second soft switching networks in series, respectively with the gates of the upper and lower mosfets, wherein each of the soft switching networks comprises a parallel arrangement of a first resistor, a forward blocking diode, a transistor with input and output terminals in parallel with the forward blocking diode and a control terminal, and a series circuit comprising one or more resistors and a reverse blocking diode and coupled to the control terminal of the transistor.

11. The class D amplifier of claim 10 wherein the transistor is bipolar transistor with its collector and emitter coupled in parallel with the forward blocking diode and its base coupled to the series circuit.

12. The class D amplifier of claim 10 wherein the transistor is mosfet transistor with its source and drain coupled in parallel with the forward blocking diode and its gate coupled to the series circuit.

13. The class D amplifier of claim 10 wherein each soft switching network further comprises a capacitor coupled between one of the input or output of the transistor and to the control terminal of the transistor.

14. The class D amplifier of claim 13 wherein the transistors are bipolar transistors and the capacitors are connected from the emitter or collector to the base.

15. The class D amplifier of claim 13 wherein the transistors are mosfets and the capacitors are connected from the source or drain to the gate.

16. A class D amplifier with reduced electromagnetic interference comprising:
   upper and lower power supply buses;
   a pulse width modulator coupled between the supply busses for receiving an input audio signal and for generating a pulse width modulated output signal where the width of a pulse is proportional to the amplitude of the audio input;
   an output bridge with upper and lower mosfets, wherein the output of the pulse width modulator is coupled to the gates of the bridge mosfets;
   first and second soft switching networks in series, respectively with the gates of the upper and lower mosfets, wherein each of the soft switching networks comprises a parallel arrangement of a first resistor, a forward blocking diode, a transistor with input and output terminals in parallel with the forward blocking diode and a control terminal, and a series circuit comprising one or more resistors and a reverse blocking diode and coupled to the control terminal of the transistor and a capacitor coupled between one of the input or output terminals of the transistor and to the control terminal of the transistor.

17. The class D amplifier of claim 16 further comprising first and second inductors, each coupled to an output terminal of the amplifier and the first inductor coupled to the upper mosfet and the second inductor coupled to the lower mosfet;
   first and second commutating diodes, the first commutating diode coupled to first inductor and to the lower bus and the second commutating diode coupled to the second inductor and the and the upper bus;
   a first diode and bead network coupled in series with the upper mosfet and the upper bus; and
   a second diode and bead network coupled in series with the lower mosfet and the lower bus.

18. A class D amplifier with reduced electromagnetic interference comprising:
   upper and lower power supply buses;
   a pulse width modulator coupled between the supply busses for receiving an input audio signal and for generating a pulse width modulated output signal where the width of a pulse is proportional to the amplitude of the audio input;
   an output bridge with upper and lower mosfets, wherein the output of the pulse width modulator is coupled to the gates of the bridge mosfets;
   first and second inductors, each coupled to an output terminal of the amplifier and the first inductor coupled to the upper mosfet and the second inductor coupled to the lower mosfet;
   first and second commutating diodes, the first commutating diode coupled to first inductor and to the lower bus and the second commutating diode coupled to the second inductor and the and the upper bus;
   a first diode and bead network coupled in series with the upper mosfet and the upper bus; and
   a second diode and bead network coupled in series with the lower mosfet and the lower bus;

first and second soft switching networks in series, respectively with the gates of the upper and lower mosfets, wherein each of the soft switching networks comprises a parallel arrangement of a first resistor, a forward blocking diode, a transistor with input and output terminals in parallel with the forward blocking diode and a control terminal, and a series circuit comprising one or more resistors and a reverse blocking diode and coupled to the control terminal of the transistor and a capacitor coupled between one of the input or output terminals of the transistor and to the control terminal of the transistor.

19. A Class D amplifier with an output stage comprising:

three inductors including a load inductor, a high side inductor and a low side inductor;

a high side power transistor for alternately coupling the load inductor to a positive voltage supply and a high side diode coupled to the high side transistor and normally reversed biased with respect to a high side supply voltage;

a low side power transistor for selectively coupling the load inductor to a negative voltage supply and a low side diode coupled to the low side transistor and normally reversed biased with respect to a low side supply voltage;

the high side inductor coupled between the high side power transistor and the load inductor and the low side inductor coupled between the low side power transistor and the load inductor; and a first pair of diodes connected together and coupled to the high side power transistor for zeroing current in the high side inductor when the high side power transistor commutates and a second pair of diodes connected together and coupled to the low side power transistor for zeroing current in the low side inductor when the low side power transistor commutates.

20. The Class D amplifier of claim 19 wherein one of the first pair of diodes is a zener diode.

21. The Class D amplifier of claim 20 wherein the zener diode is connected to the high side inductor through the high side power transistor.

* * * * *